United States Patent [19]
Okuda et al.

[11] Patent Number: 4,802,137
[45] Date of Patent: Jan. 31, 1989

[54] SEMICONDUCTOR MEMORY DEVICE

[75] Inventors: Taizo Okuda, Himeji; Shinji Saito; Nobuo Shishikura, both of Yokohama, all of Japan

[73] Assignee: Kabushiki Kaisha Toshiba, Kawasaki, Japan

[21] Appl. No.: 7,582

[22] Filed: Jan. 28, 1987

[30] Foreign Application Priority Data

Jan. 30, 1986 [JP] Japan .................................. 61-18717

[51] Int. Cl.$^4$ .............................................. G11C 7/00
[52] U.S. Cl. ..................... 365/201; 365/210
[58] Field of Search .................. 365/201, 230, 210; 371/21

[56] References Cited

U.S. PATENT DOCUMENTS

| 4,506,350 | 3/1985 | Asano et al. | 365/191 |
| 4,597,062 | 6/1986 | Asano et al. | 365/201 |
| 4,651,304 | 3/1987 | Takata | 365/201 |
| 4,692,901 | 9/1987 | Kumanoya et al. | 365/201 |

OTHER PUBLICATIONS

Japanese Patent Disclosure (Kokai) No. 57-105891, M. Yoshida, Jul. 1, 1982.
Japanese Patent Disclosure (Kokai) No. 57-172598, M. Asano, Oct. 23, 1982.

Primary Examiner—Joseph A. Popek
Attorney, Agent, or Firm—Finnegan, Henderson, Farabow, Garrett, & Dunner

[57] ABSTRACT

A semiconductor memory device includes a plurality of memory cells arranged in rows and columns, a plurality of bit lines, each coupled to the memory cells forming one column, and a MOS transistor connected between a power supply terminal and one end of every bit line. The device further includes at least one test memory cell coupled in series with the MOS transistor, thus forming a series circuit connected between the power supply terminal and the ground.

10 Claims, 3 Drawing Sheets

SEMICONDUCTOR MEMORY DEVICE

BACKGROUND OF THE INVENTION

The present invention relates to a semiconductor memory device, and more particularly, to a MOS type programmable read-only memory (ROM).

Generally, each memory cell of the MOS type programmable ROM is a double-gate, transistor cell which has a floating gate 14 electrically isolated from other elements of the cell, as is illustrated in FIG. 1. The transistor cell comprises p-type semiconductor substrate 11, n-type impurity regions 12 and 13 formed in the surface of substrate 11, floating gate 14 formed on an oxide film (not shown) formed on the surface of substrate 11, and control gate 15 formed on an oxide film (not shown) formed on floating gate 14. N-type impurity regions 12 and 13 function as a source region and a drain region, respectively, and set apart for a predetermined distance. Floating gate 14 is located above that portion of substrate 11 separating regions 12 and 13. Control gate 15 is positioned above floating gate 14.

In order to write data into the memory cell, a high voltage is applied beween control gate 15 and drain region 13, thereby imparting great energy to the electrons moving between drain region 13 and source region 12. The energized electrons move into floating gate 14. In other words, the electrons are injected into floating gate 14.

The speed of injecting the electrons into floating gate 14 has been raised by reducing the size of the memory cell, or by reducing the thickness of the oxide films formed on and under gate 14. The time required for writing data into the memory cell has therefore been shortened. However, the memory cell of the structure shown in FIG. 1 is disadvantageous. The electrons can move from floating gate 14 through the oxide film formed on or under this gate, when data is written into any other memory cell connected to the same word gate line or the same bit line. This is because, when the data is written in the other memory cell, a high voltage is inevitably applied to the control gate or drain region of the first memory cell. This undesired phenomenon will be explained in greater detail, with reference to FIG. 2.

FIG. 2 shows a semiconductor memory device comprising word lines WL1 and WL2, bit lines BL1, and BL2, and memory cells M11, M12, M21 and M22 arranged in rows and columns. The control gates of memory cells M11 and M12, forming the first row, are coupled to word line WL1. The control gates of memory cells M21 and M22, following the second row, are connected to word line WL2. The drains of memory cells M11 and M21, forming the first column, are coupled to bit line BL1. The drains of memory cells M12 and M22, forming the second column, are coupled to bit line BL2. The memory device further comprises selection transistors Q1, Q2 ... Qn. These transsitors Q1, Q2 ... Qn are connected at one end to bit lines BL1, BL2 ... BLn, respectively, and at the other end to writing-voltage terminal Vpp by load transistor QD. Transistor QD is controlled by control signal D.

Now, assume that data is first written into memory cell M11 and then into memory cell 21. First, a high voltage is applied between word line WL1 and bit line BL1. All other word lines and all other bit lines are set at 0V. As a result, the data is written into memory cell M11. Then, the high voltage is applied between word line WL1 and bit line BL2, thereby writing data into memory cell M21. This high voltage is applied to the controlg gate of memory cell M11 although the data need not be written in memory cell M11. Consequently, the electrons may drain from the floating gate of memory cell M11 through the oxide film formed on the floating gate, under the influence of the electric field generated between the control gate and floating gate of memory cell M11 through the oxide film formed on the floating gate, under the influence of the electric field generated between the control gate and floating gate of memory cell M11, unless the oxide film between the floating and control gates of memory cell M11 has a sufficient insulating strength.

Assume that data is first written into memory cell M11 and then into memory cell 12. In this case, a high voltage is applied between word line WL2 and bit line BL1 after data has been written into memory cell M11. The high voltage is also applied to the drain of memory cell M11. Consequently, the electrons may move from the floating gate of cell M11 to the drain of cell M11 unless the oxide film formed between the drain and floating gates has a sufficient insulating strength.

In either case, the data cannot be successfully written in memory cell 11. The longer the time for writing data in each memory cell, the more frequently the data cannot be written. Therefore, MOS type programmable ROMs are tested before they are delivered to the customers, by applying data-writing voltage to them for the time specified in the test manual, although the time actually required for writing data into the memory cells can be much shorter. This test procedure must be performed in order not to deliver MOS type programmable ROMs which have failed to store the data, due to the undesired phenomenon that electrons drain out of the floating gates of some memory cells.

It has been proposed that a so-called "gate-stress circuit" or a so-called "drain-stress circuit" be used in order to check the phenomenon effectively. The gate-stress circuit responds to a special control signal supplied from an external device, and applies a high voltage to all word gate lines of the MOS type programmable ROM and also resets all bit lines of the ROM at 0V. After electrons have been injected into the floating gates of all memory cells of the ROM within a short data-writing time, the gate-stress circuit is operated to set the floating gates of the memory cells at 0V and to set the control gates of the memory cells at a high voltage level. Hence, it can be quickly determined whether or not electrons have drained out of the floating gates of the memory cells due to the insufficient insulating strength of the oxide film interposed between the floating gates, on the one hand, and the control gates, on the other.

The drain-stress circuit applies a high voltage to all bit lines of the MOS type programmable ROM, in response to a control signal supplied from an external device. When the circuit applies the high voltage to the drain lines, all word lines are set at 0V. As a result, it can be determined whether or not electrons have drained from the floating gates of the memory cells due to the insufficient insulating strength of the oxide film provided between the floating gates, on the one hand, and the control gates, on the other.

As has been stated, when the drain-stress circuit applied the high voltage to the drain lines, the control gates of all memory cells are set at 0V. Therefore, none of the cells are turned on, and the voltage applied to the drain lines is inevitably higher than the voltage which will be applied to the drain lines to write data in the cells. In the case of the memory device shown in FIG. 2, a high voltage is applied to the drain of memory cell M11 after data has been written in memory cell M11, in order to write data in memory cell M12. At this time, memory cell M12 is turned on since a high voltage is applied to its control gate. The drain voltage is applied to its control gate. The drain voltage of memory cell M12 is divided by the ratio of the resistance of load transistor QD to the resistance of memory cell M12. Here arises a problem. Due to the use of the drain-stress circuit, none of the memory cells are turned on, and all cells are tested with a drain voltage higher than the data-writing drain voltage. It is therefore possible that the memory device is regarded as storing erroneous data, even if it stores the correct data when operated under the normal condition.

SUMMARY OF THE INVENTION

Accordingly, the object of the present invention is to provide a semiconductor memory device which can be subjected to drain-stress test under the conditions substantially the same as those under which it is used.

This object is achieved by a semiconductor memory device comprising a plurality of memory cells arranged in rows and columns, a plurality of bit lines, each coupled to the memory cells forming one column, a plurality of word lines, each coupled to control gates of the memory cells forming one row, input buffer circuits for receiving address signals, selection means for selectively energizing the bit lines and word lines in response to output signals of the input buffer circuits, a power supply terminal, a reference potential terminal, a switching circuit coupled to one end to the power supply terminal, and at the other end to the bit lines, thereby to selectively couple the power supply terminal to the bit lines, a test circuit having at least one test memory cell coupled in series with the switching circuit, thus forming a series circuit connected between the power supply terminal and the reference potential terminal, and control unit for turning on the test memory cell while the memory cells are undergoing a drain-stress test.

During the drain-stress test, the test memory cell is turned on. Hence, all memory cells are put under the conditions substantially the same as those under which data is written in the memory cells. The drain-stress test can, therefore, be readily conducted on the memory cells.

DETAILED DESCRIPTION OF THE PREFERRED EMBODIMENTS

One embodiment of the invention, i.e., a semiconductor memory device, will now be described with reference to FIG. 3. For brevity, this device is a 16-bit memory. Nonetheless, the memory capacity of the device is not limited to this particular value.

Figure 1:
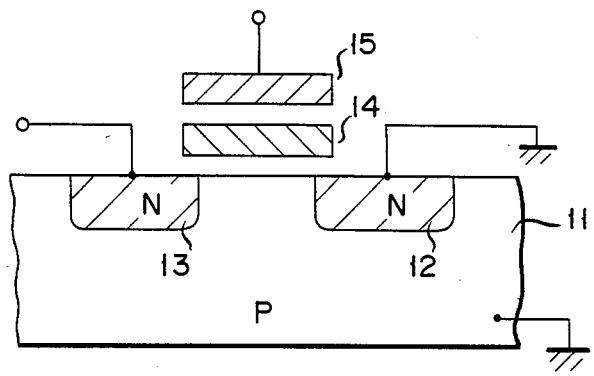
FIG. 1 schematically shows a memory cell.
Figure 2:
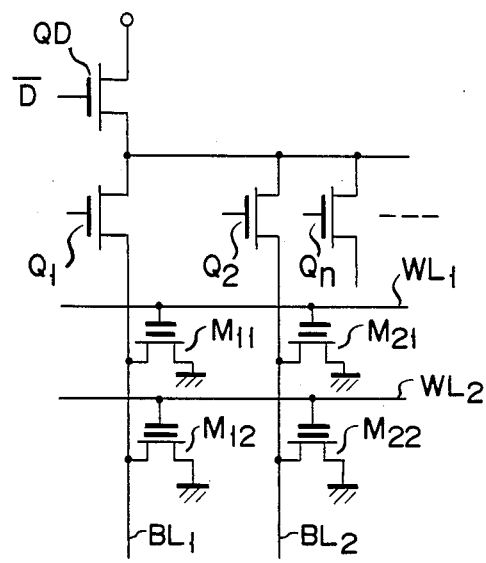
FIG. 2 is a circuit diagram of a conventional, semiconductor memory device which can be subjected to a drain-stress test.
Figure 3:
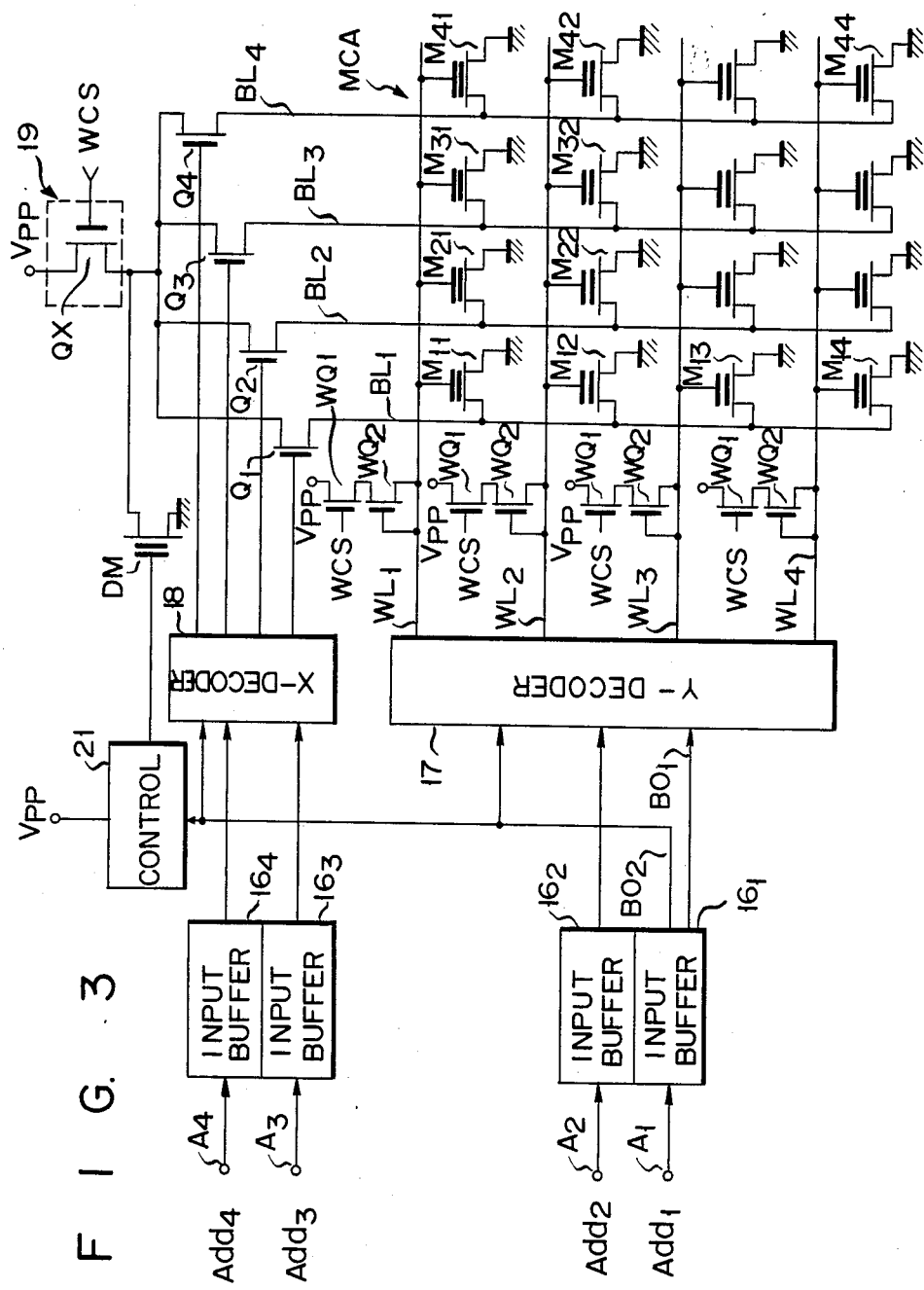
FIG. 3 is a circuit diagram of a semiconductor memory device according to the invention, which can be reliably subjected to a drain-stress test.

As is shown in FIG. 3, a memory cell array MCA has memory cells M11 to M44 arranged in rows and columns. The control gates of memory cells M11, M21, M31, and M41, forming the first row, are coupled to word line WL1. The control gates of memory cells M12, M22, M32 and M42, forming the second row, are coupled to word line WL2. Those of cells M13, M23, M33 and M34, forming the third row, are coupled to word line WL3. And those of cells M14, M24, M34, and M44, forming the fourth or last row, are coupled to word line WL4. The drains of memory cells M11, M21, M31, and M41, forming the first column, are coupled to bit line BL1. The drains of memory cells M21, M22, M23, M24, forming the second column, are coupled to bit line BL3. And the drains of memory cells M41, M42, M43, and M44, forming the fourth or last column, are coupled to bit line BL4.

Address signals Add1 to Add4 supplied to address input terminals A1 to A4 are input to input buffers $16_1$ to $16_4$. Two outputs BO1 and BO2 of input buffer $16_1$ are supplied to Y-decoder 17. The outputs of input buffers $16_3$ and $16_4$, and output BO2 are supplied to X-decoder 18. During the ordinary use of the memory device, Y-decoder 17 decodes the output BO1 of input buffer $16_1$ and the output of input buffer $16_2$, whereby one of word lines WL1 to WL4 is selected also during the ordinary use of the device, X-decoder 18 decodes the outputs of input buffers $16_3$ and $16_4$, thus turning on one of transistors Q1 to Q4 for selecting the bit lines, whereby one of bit lines BL1 to BL4 is selected. As a result, one memory cell Mij (i=1 to 4, j=1 to 4) is selected from the memory cell array MCA. Transistors Q1 to Q4 are connected to one end to a connection node. A data-writing voltage Vpp is applied to the connection node of these transistors Q1 to Q4 through write/non-write switching circuit 19. Circuit 19 includes MOS transistor QX which is turned on and off by write-control signal WCS supplied from an external device. Test memory cell DM, having the same structure as memory cells M11 to M44, is connected between the ground and the connection node of transistors Q1 to Q4. Memory cell DM is turned on and off by the output of control circuit 21. Control circuit 21 is controlled by output BO2 of input buffer $16_1$ to determine whether or not voltage Vpp should be applied to test memory cell DM. Output BO2 of input buffer $16_1$ is supplied to both Y-decoder 17 and X-decoder 18, as has been described above. Hence, when output BO2 is at the high level, all bit lines BL1 to BL4 and all word lines WL1 and WL2 are energized. These transistors WQ1 and WQ2 form a word line-driving circuit for applying data-writing voltage Vpp to any selected word line. Like MOS transistor QX of switching circuit 19, transistors WQ1 and WQ2 may be controlled by signal WCS.

Input buffer $16_1$ has two threshold voltages, for example, 2.5 V and 5.5 V. Each of address signals Add1 to Add4 can be at one low level and two high levels. The low level is about 0V. The first high level ranges from 3.0 V to 5.0 V, and the second high level is over 6.0V. When address signal Add1 supplied to address input terminal A1 is at the low level, the output BO1 of input buffer $16_1$ is at the "0" level. When address signal Add1 is at the first high level, the output BO1 is at the "1" level. When signal Add1 is at the second high level, the output BO2 of input buffer $16_1$ is at the "H" level.

Table 1 shows the relationship between the input and output of input buffer $16_1$. Output $\overline{BO1}$, which is an inversion of output BO1 and can be used in place of output BO1, is also shown in this table.

TABLE 1

| Input Level (Add1) | Signal Level | BO1 | ($\overline{BO1}$) | BO2 | Mode |
|---|---|---|---|---|---|
| Low level | 0 | 0 | (1) | 0 | Output |
| First high level | 1 | 1 | (0) | 0 | Output |
| Second high level | H' | * | (*) | H | Cell select |

In Table 1, the "0" level is nearly equal to 0V, the "1" level is a high level close to 5 V, the "H" level is a high level over 6 V, and "H'" level is higher than the low level close to 0V. The mark "*" means that the level is either "0" or "1", in accordance with the circuit design.

X-decoder 18 can produce four outputs 1X to 4X in the data-writing mode. (In the data-writing mode, address at the "H'''" level.) Y-decoder 17 can generate four outputs 1Y to 4Y in the data-writing mode, too. Table 2 shows the relationship between address signals Add1, Add3 and Add4, on one hand, and the outputs 1X to 4X of X-decoder 18, on the other. Table 3 shows the relationship between address signal Add1 and Add2, on one hand, and the outputs 1Y to 4Y of Y-decoder 17, on the other.

TABLE 2

| Add3 | Add4 | Add1 | 1X | 2X | 3X | 4X |
|---|---|---|---|---|---|---|
| 0 | 0 | 0 | H | 0 | 0 | 0 |
| 0 | 1 | 0 | 0 | H | 0 | 0 |
| 1 | 0 | 0 | 0 | 0 | H | 0 |
| 1 | 1 | 0 | 0 | 0 | 0 | H |
| 0 | 0 | H' | H | H | H | H |
| 0 | 1 | H' | H | H | H | H |
| 1 | 0 | H' | H | H | H | H |
| 1 | 1 | H' | H | H | H | H |

In Table 2, it is also possible to use address signal Add1 of "1" instead of "0".

TABLE 3

| Add1 | Add2 | 1Y | 2Y | 3Y | 4Y |
|---|---|---|---|---|---|
| 0 | 0 | H | 0 | 0 | 0 |
| 0 | 1 | 0 | H | 0 | 0 |
| 1 | 0 | 0 | 0 | H | 0 |
| 1 | 1 | 0 | 0 | 0 | H |
| H' | 0 | 0 | 0 | 0 | 0 |
| H' | 1 | 0 | 0 | 0 | 0 |

When signal Add1 supplied to address input terminal A1 is set at the "H" level after the ordinary data-writing, all outputs 1X to 4X supplied to bit lines Bl1 to BL4 are set at the "H" level. Simultaneously, the potentials of all word lines WL1 to WL4, i.e., the outputs 1Y to 4Y of Y-decoder 17, are 0V. The memory device is, therefore, subjected to the drain-stress test. In this condition, control circuit 21 is turned on by the output BO2 of input buffer $16_1$, which is at the "H" level. As a result, data-writing voltage Vpp is applied to the control gate of test memory cell DM. When write control signal WCS is supplied to write/non-write switching circuit 19 in this condition, voltage Vpp is applied to the drain of cell in this condition, voltage Vpp is applied to the drain of memory cell DM through MOS transistor QX. Now that voltage Vpp is applied to the drain and control gate of test memory cell DM, memory cell DM is turned on. The voltage applied to the drains of memory cell M11 to M44 has the value obtained by dividing voltage Vpp by the radio of the resistance of transistor QX to the resistance of cell DM, said value being the ordinary data-writing voltage. That is, the memory device can be tested under which it is used. Hence, there is no risk that the device is regarded as storing erroneous data even if it stores the correct data when operated under the normal condition.

Figure 4:
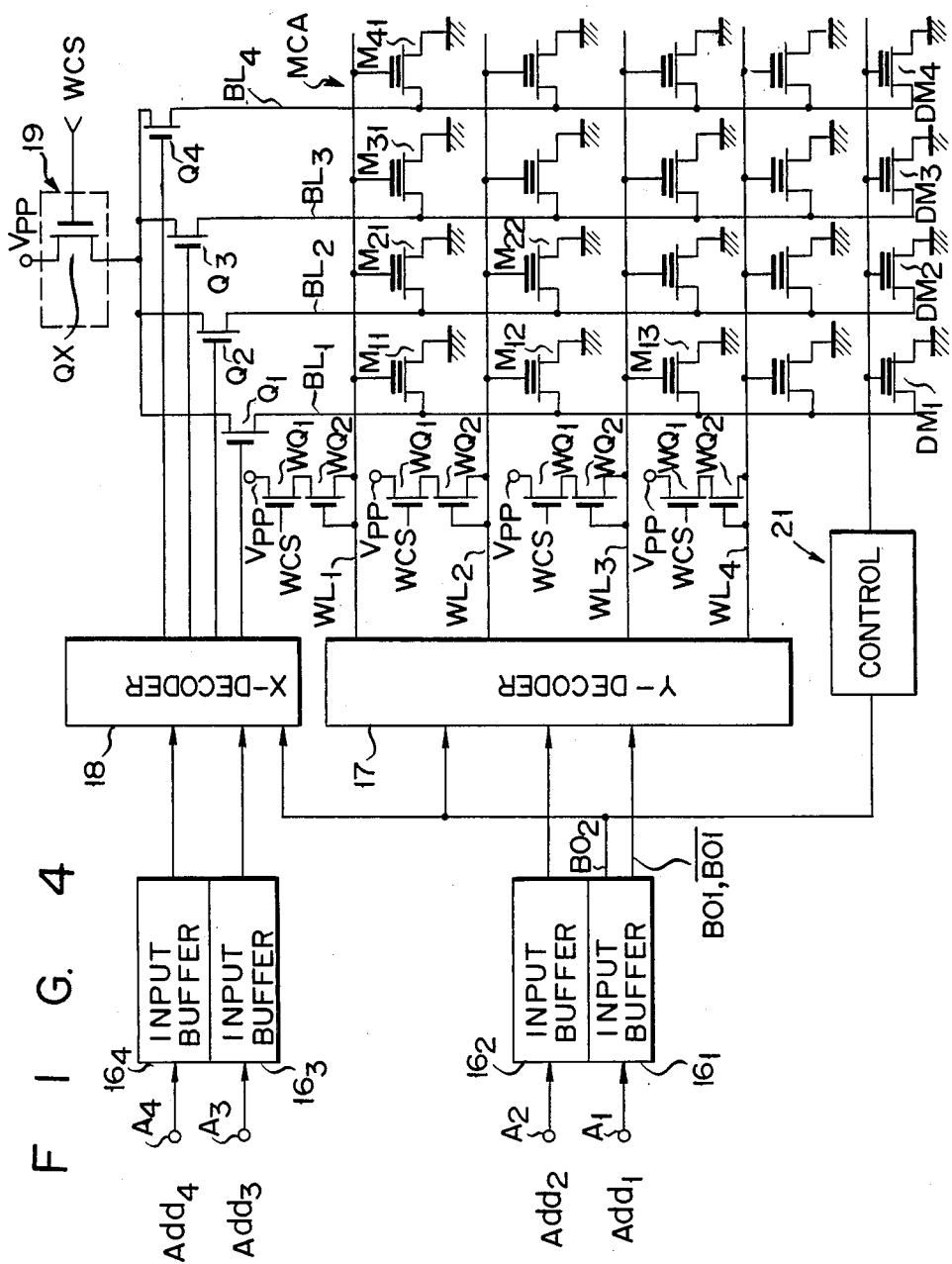
FIG. 4 is a circuit diagram of another semiconductor memory device according to the invention.

FIG. 4 shows another embodiment of the present invention. In this embodiment, test memory cells DM1 to DM4 are connected to bit lines BL1 to BL4, whereas, in the embodiment of FIG. 3, only one test memory cell DM is provided at the output block. In FIG. 4, the same numerals and symbols are used to designate the same elements as those shown in FIG. 3, which will not be described in detail. Test memory cells DM1 to DM4 are turned on by an output BO2 at the "H" level when the memory device (FIG. 4) is put to the drain-stress test. Therefore, the potential of each of bit lines BL1 to BL4 is set at the value obtained by dividing data-writing voltage Vpp by the ratio of the resistance of MOS transistor QX to the resistance of the test memory cell coupled to the bit line. The memory device shown in FIG. 4 performs, in principle, the same operation as the device of FIG. 3, and hence achievess the same advantage.

The present invention is not limited to the embodiments described above. For instance, control circuit 21 can be dispensed with the embodiment shown in FIG. 3, and the output BO2 of input buffer $16_1$ can be used to control test memory cell DM. Moreover, control circuit 21 (FIG. 3) can be used in the embodiment shown in FIG. 4, in order to control test memory cells DM1 to DM4.

What is claimed is:

1. A semiconductor memory device comprising:
   a plurality of memory cells arranged in rows and columns;
   a plurality of bit lines, each coupled to the memory cells forming a respective one of said columns;
   a plurality of word lines, each coupled to control gates of the memory cells forming a respective one of said rows;
   input buffer means for receiving address signals;
   selection means for selectively energizing said bit lines and said word lines in response to the output signals of said input buffer means;
   a power supply terminal;
   a reference potential terminal;
   switching means, coupled at one end to said power supply terminal and at the other end to said bit lines, for selectively coupling said power supply terminal to said bit lines to perform a drain-stress test on said plurality of memory cells;
   a test circuit having at least one dummy cell coupled in series with said switching means and to said reference potential terminal, thus forming a series circuit connected between said power supply terminal and said reference potential terminal; and
   control means for turning on said dummy cell while said memory cells are undergoing said drain-stress test.

2. A semiconductor memory device according to claim 1, wherein said switching means comprises a MOS transistor.

3. A semiconductor memory device according to claim 1, wherein said input buffer means includes a plurality of input buffers, a specified one of which causes said control means to turn on said dummy cell upon receipt of an address signal at a voltage level higher than a predetermined level.

4. A semiconductor memory device according to claim 3, wherein said dummy cell is a memory cell coupled between the other end of said switching means and said reference potential terminal, and having a control gate coupled to said control means.

5. A semiconductor memory device according to claim 4, wherein said control means comprises said specified input buffer, and a switch coupled between said power supply terminal and the control gate of said dummy cell, said switch being turned on and off by the output of said specified input buffer.

6. A semiconductor memory device according to claim 3, wherein said control means comprises said specified input buffer, and a switch coupled between said power supply terminal and the control gate of said dummy cell, said switch being turned on and off by the output of said specified input buffer.

7. A semiconductor memory device according to claim 1, wherein said test circuit includes a memory cell coupled between the other end of said switching means and siad reference potential terminal, and having a control gate coupled to said control means.

8. A semiconductor memory device comprising:
a plurality of memory cells arranged in rows and columns;
a plurality of bit lines, each coupled to the memory cells forming a respective one of said columns;
a plurality of word lines, each coupled to control gates of the memory cells forming the respective one of said rows;
input buffer means for outputting memory cells selection signals in response to received addressed signals;
selection means for selectively energizing said bit lines and said word lines in response to the memory cell selection signals of said input buffer means;
a power supply terminal;
a reference potential terminal;
switching means, coupled at a first end to said power supply terminal and at a second end to said bit lines, for selectively coupling said power supply terminal to said bit lines to perform a drain-stress test on said plurality of memory cells;
a test circuit having a plurality of dummy cells coupled between said bit lines and said reference potential terminal; and
control means for turning on said dummy cells while said memory cells are undergoing said drain-stress test.

9. The semiconductor memory device of claim 8 wherein said input buffer means includes a plurality of input buffers, a specified one of which causes said control means to turn on said dummy cells upon receipt of an address signal at a voltage level higher than a predetermined level.

10. The semiconductor memory device of claim 8 wherein said dummy cells are memory cells.

* * * * *